US006842662B1

(12) United States Patent
Weidler et al.

(10) Patent No.: US 6,842,662 B1
(45) Date of Patent: Jan. 11, 2005

(54) METHOD AND APPARATUS FOR FULLY ALIGNED FLIP-CHIP ASSEMBLY HAVING A VARIABLE PITCH PACKAGING SUBSTRATE

(75) Inventors: Jaime D. Weidler, Sunnyvale, CA (US); Robert A. Newman, Santa Clara, CA (US); Jinsu Kwon, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/407,754

(22) Filed: Apr. 4, 2003

(51) Int. Cl.$^7$ .......................... G06F 19/00; H01L 21/66

(52) U.S. Cl. ........................................ 700/121; 438/15

(58) Field of Search ...................... 438/14–18; 700/121, 700/94, 95, 150, 179

(56) References Cited

U.S. PATENT DOCUMENTS 6,555,401 B2 * 4/2003 Koduri ........................ 438/18

* cited by examiner

Primary Examiner—David A. Zarneke
Assistant Examiner—Asok Kumar Sarkar
(74) Attorney, Agent, or Firm—Farjami & Farjami LLP

(57) ABSTRACT

A method and an apparatus for preventing misalignment of semiconductor packaging assembly materials. In particular, a method of fabricating a fully aligned flip-chip assembly having a variable pitch packaging substrate, involves: providing a set of input data; calculating a set of intermediate data using the input data set; calculating a set of final substrate pad coordinates using the intermediate data set, thereby providing a set of output data; providing a packaging substrate having a plurality of substrate pads thereon formed according to the output data set to compensate for any inchoate thermogeometric hysteresis arising from any mismatched coefficients of thermal expansion, and thereby fabricating the flip-chip assembly having a variable pitch packaging substrate, and an assembly thereby fabricated which is more robust to any temperature-induced stress.

18 Claims, 7 Drawing Sheets

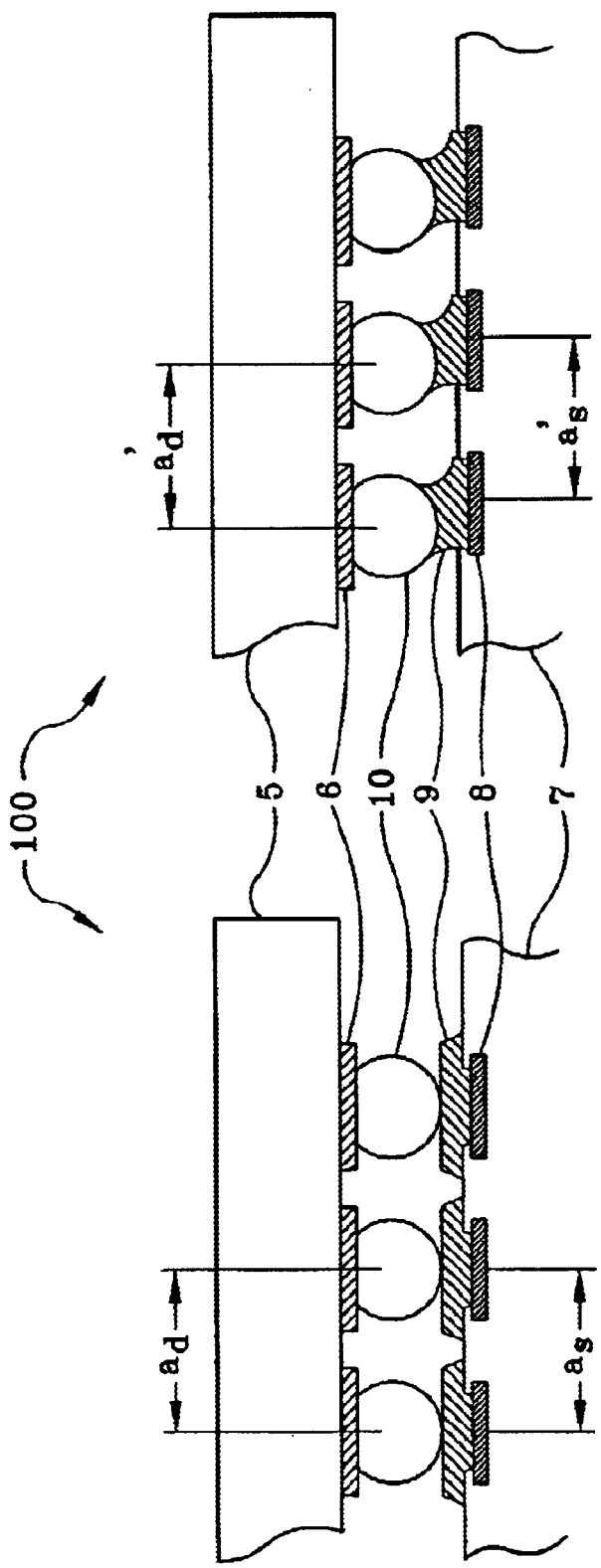
(Prior Art)
Figure 1A
(Prior Art)
Figure 1B

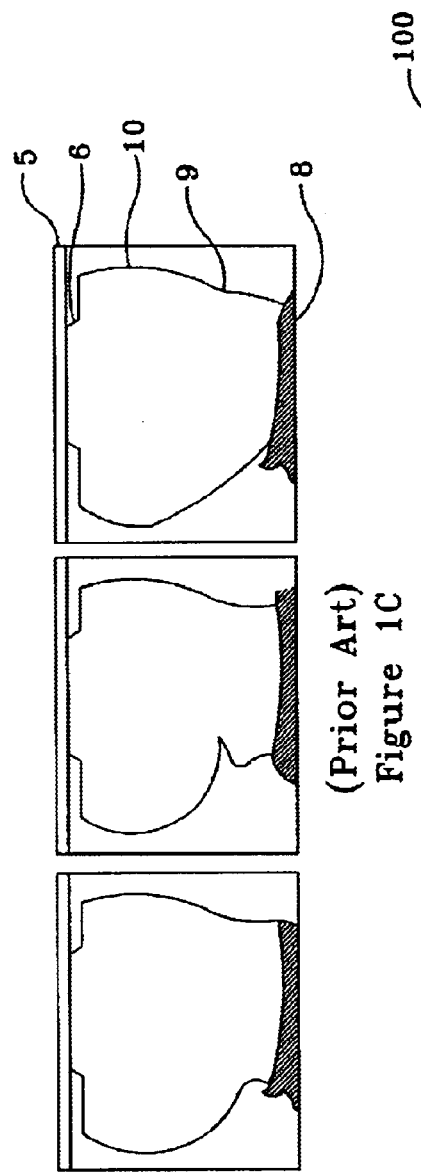
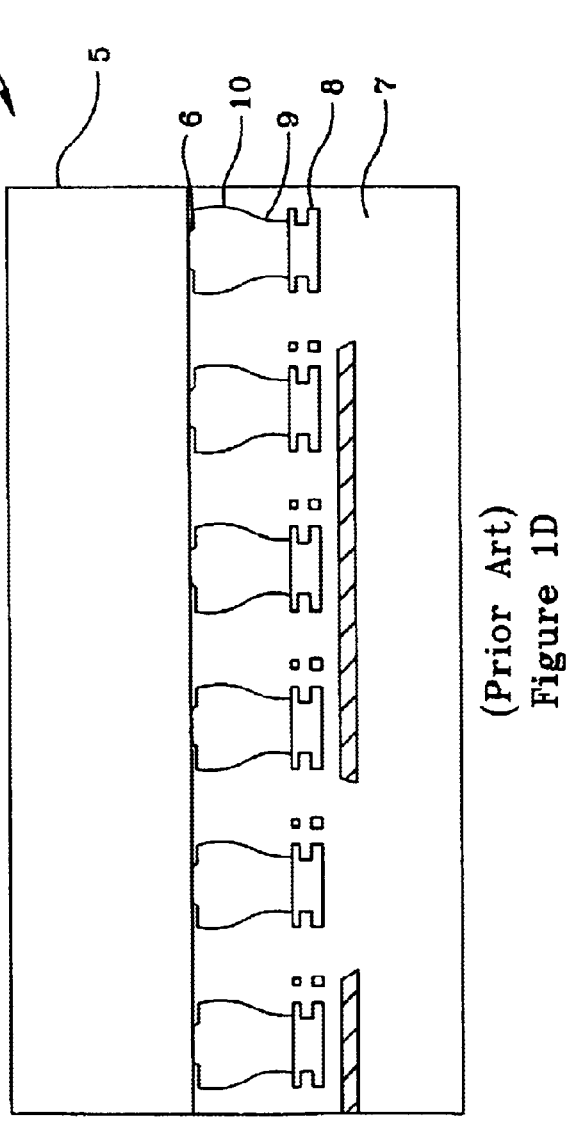
(Prior Art) Figure 1C
(Prior Art) Figure 1D

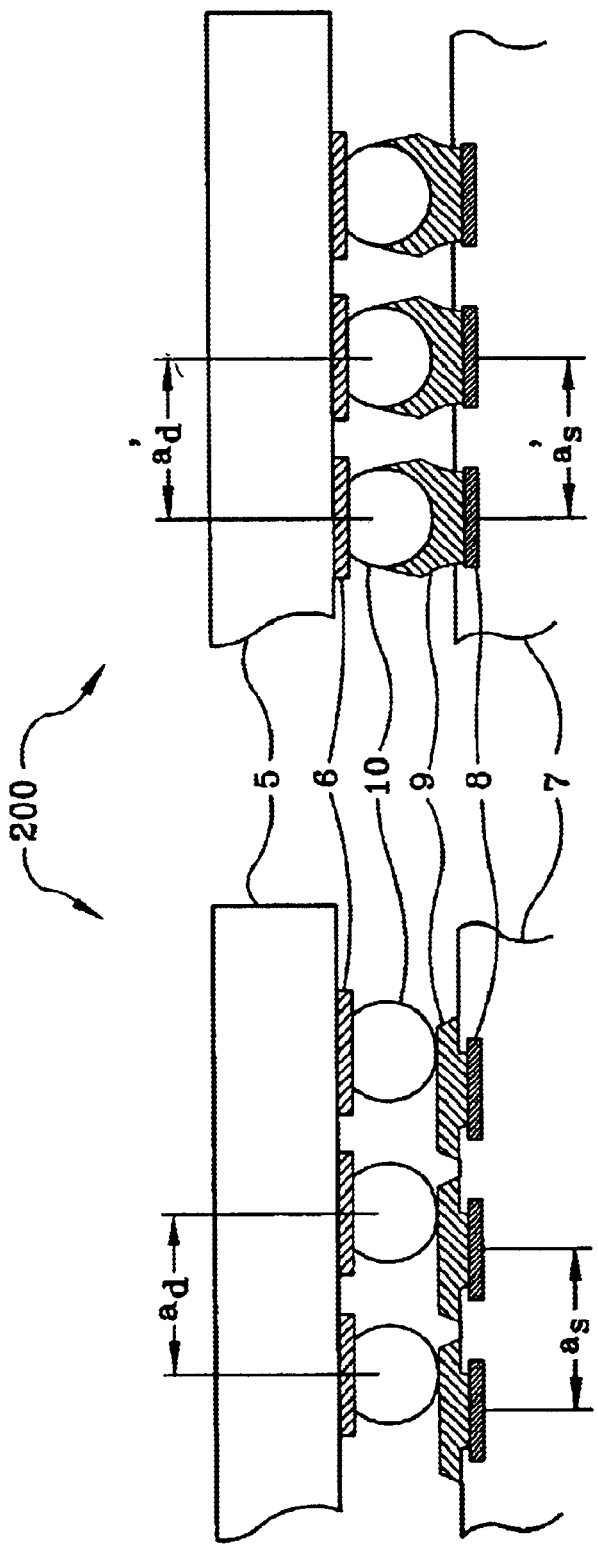
Figure 2B
Figure 2A

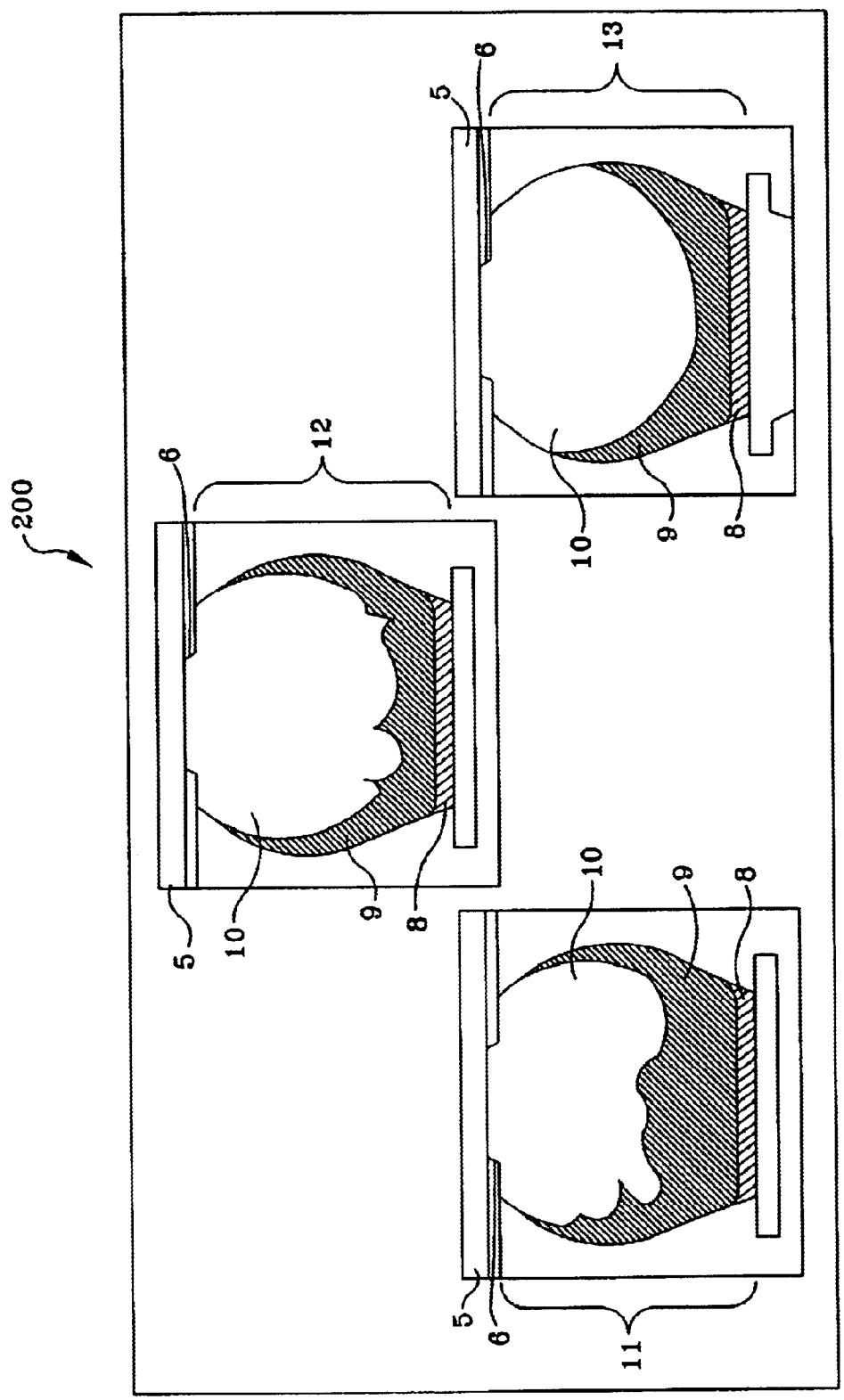
Figure 2C

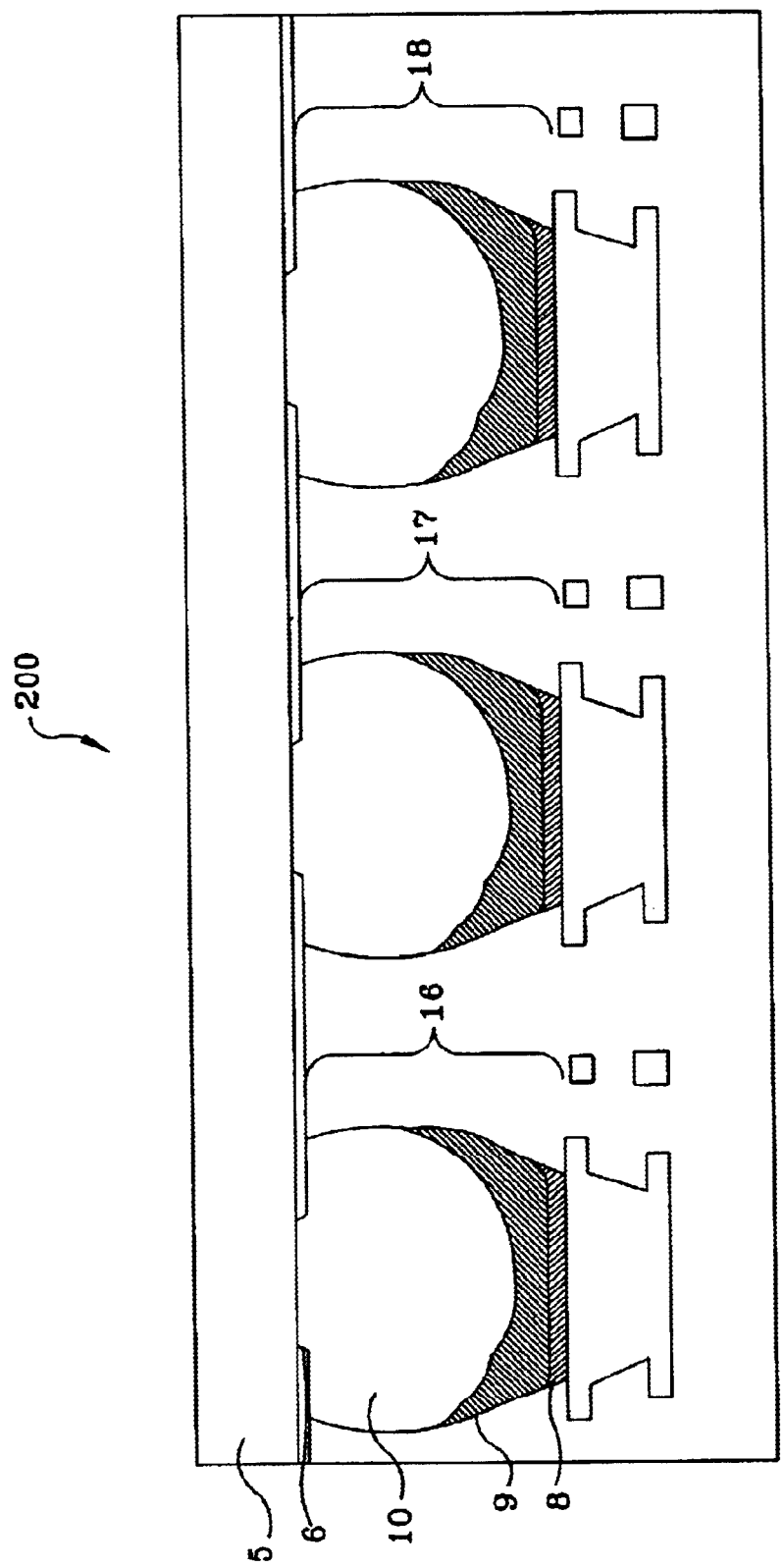
Figure 2D

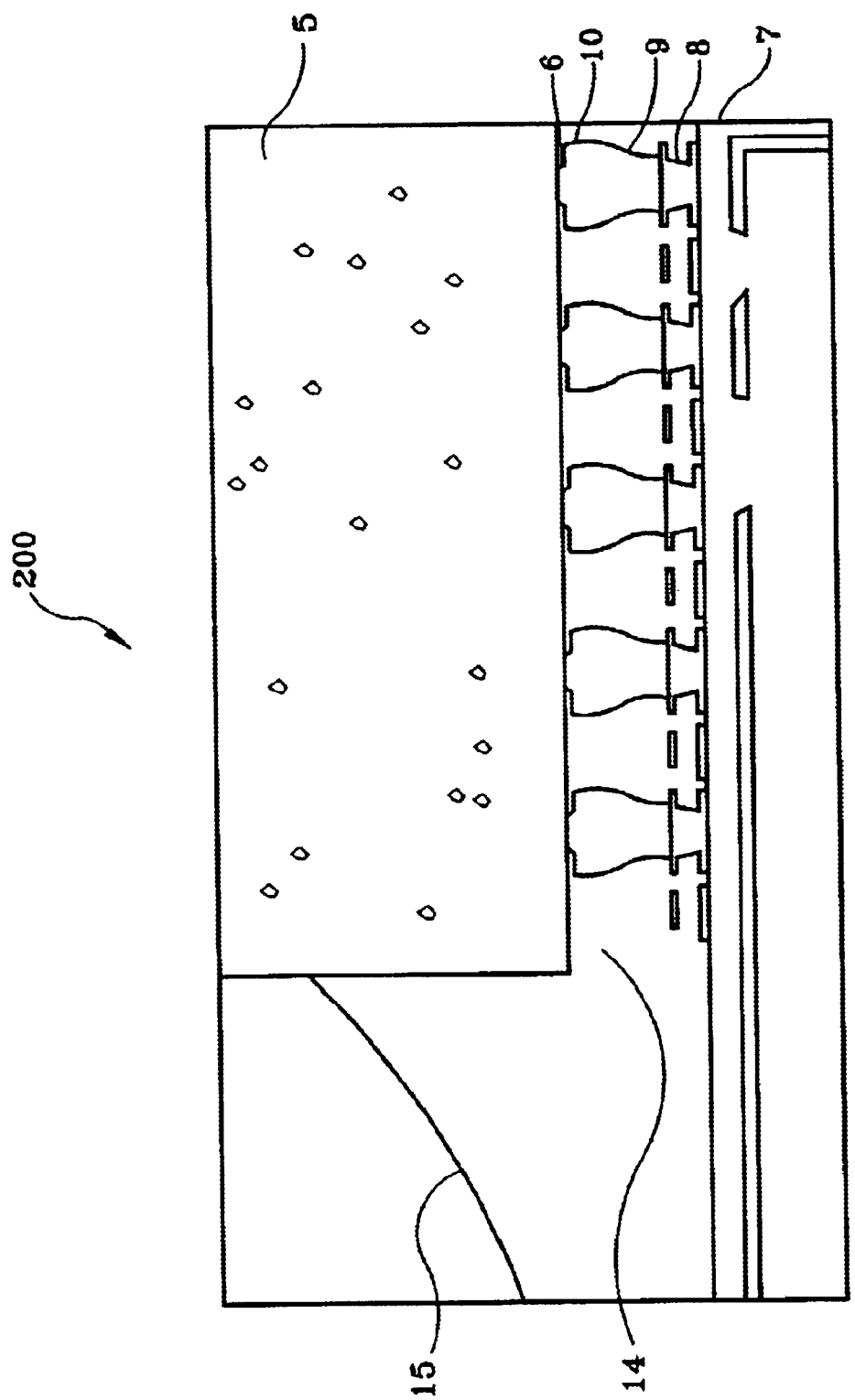
Figure 2E

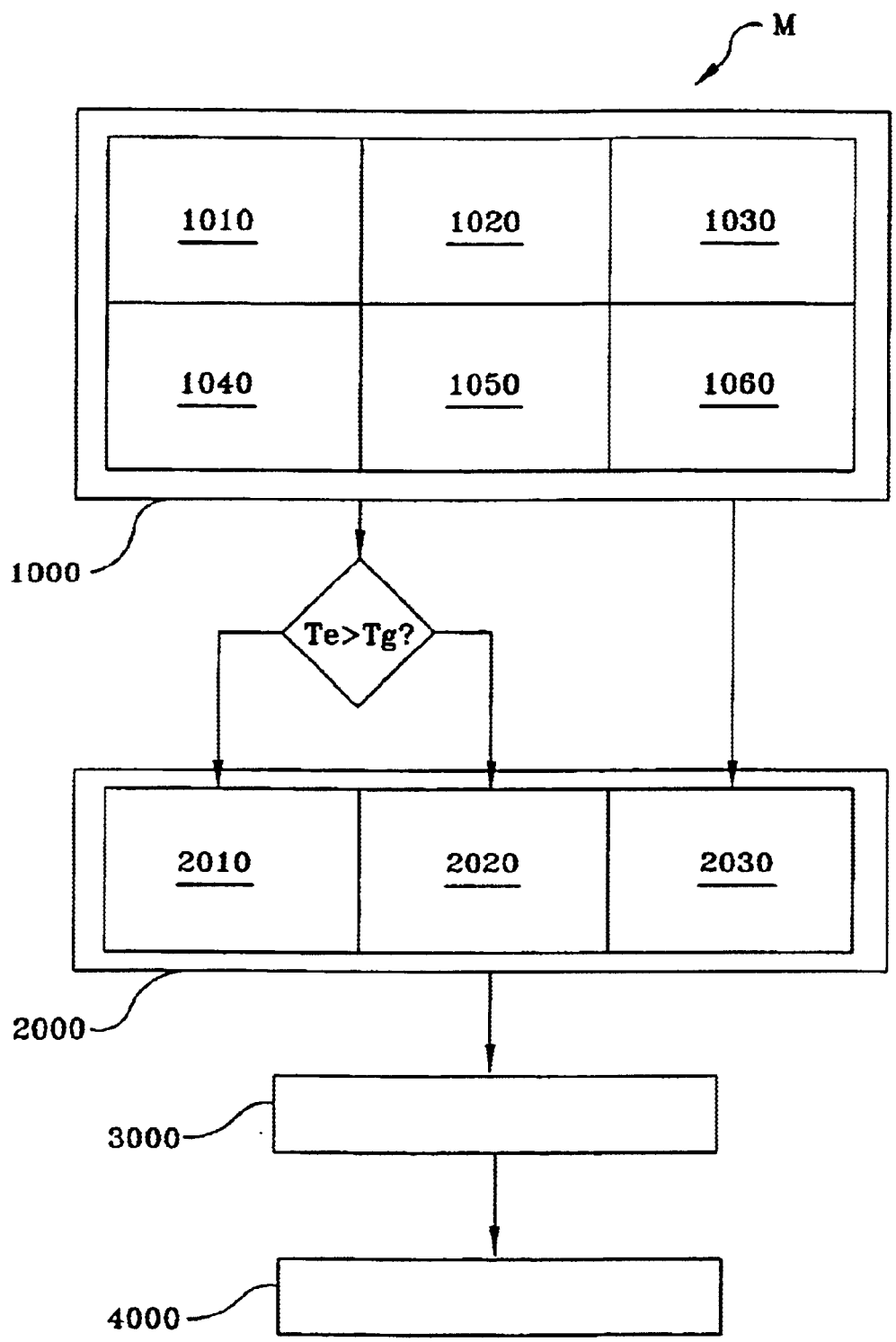
Figure 3

METHOD AND APPARATUS FOR FULLY ALIGNED FLIP-CHIP ASSEMBLY HAVING A VARIABLE PITCH PACKAGING SUBSTRATE

TECHNICAL FIELD

The present invention relates to the assembly and the packaging of semiconductor chips. More particularly, the present invention relates to assembly and the packaging of flip-chips. Even more particularly, the present invention relates to reducing stress in the flip-chip assembly.

BACKGROUND ART

Currently, for chip assemblies, the semiconductor industry has been utilizing solder-bumped flip-chip technology, such as "C4" (controlled-collapse chip connection), wherein solder bumps are formed on a solder-wettable terminal on the chip or die (i.e., wafer bumping) on a die pad which corresponds to a package solder element formed on a solder-wettable terminal on the package substrate (i.e., substrate preparation). The solder joints are formed by reflowing the package solder element onto the solder bump, wherein the other remaining elements of the assembly are subjected to the same heated environment as the package substrate. The chip or die and the substrate, being formed from different materials, are mismatched by their respective coefficients of thermal expansion. This being so, the solder bump is usually misaligned while reflowing the package solder element in forming the solder joints in the related art assemblies as the package substrate tends to expand at a rate greater than does the chip, thereby compromising their structural integrity, and thereby unduly limiting their electrical and thermal throughput.

FIG. 1A is a cross-sectional view of a flip-chip assembly 100, comprising: a die 5 having a plurality of die pads 6 thereon formed with a design die pad pitch value (i.e., manufacturer's value) $a_d$; a package substrate 7 having a plurality of substrate pads 8 thereon formed with a design substrate pad pitch value (i.e., manufacturer's value) $a_s$ to match the design die pad pitch value $a_d$ (i.e., $a_s=a_d$); a corresponding plurality of solder bumps 10 formed on the plurality of die pads 6; and a corresponding plurality of package solder elements 9 formed on the plurality of substrate pads 8, wherein the plurality of solder bumps 10 are disposed over the corresponding plurality of package solder elements 9, prior to a reflow process (i.e, a flip-chip attachment process), in accordance with the prior art.

FIG. 1B is a cross-sectional view of the flip-chip assembly 100, as shown in FIG. 1A, comprising: a die 5 having a plurality of die pads 6 thereon formed with a thermally expanded and partially contracted die pad pitch value $a_d'$; a package substrate 7 having a plurality of substrate pads 8 thereon formed with a thermally expanded and partially contracted substrate pad pitch value $a_s'$ which no longer matches the design substrate pad pitch value $a_{s_1}$ the design die pad pitch value $a_d$, nor the thermally expanded and partially contracted die pad pitch value $a_d'$ (i.e., $a_s' \neq a_s \neq a_d \neq a_d'$); a corresponding plurality of solder bumps 10 formed on the plurality of die pads 6; and a corresponding plurality of package solder elements 9 formed on the plurality of substrate pads 8, wherein the plurality of solder bumps 10 are disposed over the corresponding plurality of package solder elements 9, and wherein the plurality of package solder elements 9 have been reflowed onto the corresponding plurality of solder bumps 10, thereby inducing thermal stress in the assembly 100, in accordance with the prior art.

Referring to prior art FIGS. 1C and 1D, the plurality of die pads 6 and the plurality of substrate pads 8 expand at different rates, due to their respective and distinct coefficients of thermal expansion (CTE), upon exposure to heat at the reflow temperature during the flip-chip attachment process. The plurality of package solder elements 9 melt and form both the electrical and the structural connections between the plurality of substrate pads 8 and the plurality of die pads 6, wherein the plurality of die pads 6 tend to become misaligned with the plurality of substrate pads 8 due to a heat-induced "offset." After reflow attachment, the assembly 100 is cooled, whereby the substrate 7 both thermally expands (swells) and contracts (shrinks) at a rate different from that of the die 5 due to their mismatched CTE, wherein an undesirable condition of inchoate thermogeometric hysteresis is induced. In essence, neither the plurality of substrate pads 8 nor the plurality of die pads 6 fully return to their original design pitch values (i.e., manufacturer's value), but retain some new pitch value causing significant misalignment.

Further, at some critical temperature (i.e., an equilibrium temperature $T_e$), the substrate 7 and the die 5 are sufficiently attached so that no additional changes in pitch will occur as the assembly 100 is cooled below $T_e$. Internal stress which is induced from the cooling of the assembly 100 below the critical temperature $T_e$ is then absorbed by the substrate 7 and the die 5 in the form of warpage rather than through any further planar contraction in substrate pitch and the die pitch. Also, the plurality of package solder elements 9 tend to "neck" or narrow in cross-sectional area during the misalignment, compromising both electrical and structural performance (FIGS. 1C and 1D are schematic representations of micrographs showing the "necking" problem.). As such, the prior art assembly 100 will always be necked and misaligned or skewed after a conventional reflow attachment process.

In addition, such misalignment results from the limited die placement programming currently used in the semiconductor industry. Computer-assisted design (CAD) data has been used to generate placement data from die and substrate geometries, without any regard to the thermal effects caused by reflowing the package solder onto the solder bump. Some prior art practices involve chip realignment procedures for correcting the inherent prior art misalignment at the die attachment stage of the processing (e.g., yet another solder reflow, etc.). Thus, as the die pitch (i.e., bump to bump centers) decreases, a potential for lower manufacturing yield at the flip-chip attach (FCA) stage exists due to the prior art non-variable substrate pitch configuration and to the limitations of current die placement machine tolerances. Therefore, a long-felt need exists for a method and an apparatus for preventing solder joint misalignment in the completed flip-chip assembly, rather than for merely realigning the solder joint after the reflow stage.

DISCLOSURE OF THE INVENTION

Accordingly, the present invention prevents solder bump misalignment by providing a method of fabricating a fully aligned flip-chip assembly having a variable pitch packaging substrate formed by preconfiguring a substrate material that will fully align with the die even after die attachment, the method comprising: providing a set of input data; calculating a set of intermediate data using the input data set; calculating a set of final substrate pad coordinates using the intermediate data set, thereby providing a set of output data; providing a packaging substrate having a plurality of substrate pads thereon formed according to the output data set;

providing a die having a plurality of die pads thereon formed; forming a plurality of solder bumps on the plurality of die pads; forming a plurality of package solder elements on the plurality of substrate pads; and reflowing the plurality of package solder elements onto the plurality of solder bumps, thereby forming an electrical connection and a structural connection between the plurality of die pads and the plurality of substrate pads, thereby compensating for any inchoate thermogeometric hysteresis arising from any mismatched coefficients of thermal expansion, and thereby fabricating the fully aligned flip-chip assembly having the variable pitch packaging substrate, and an assembly thereby fabricated which is more robust to any temperature-induced stress. The present method may further comprise a software program as well as hardware for facilitating execution of the operative steps.

An advantage of the present invention includes increasing the package reliability, because the solder material (the solder bump and the package solder) is accurately aligned between both the die pad and the substrate pad, solving the misalignment problem so prevalent in the prior art using packaging substrates which are unable to compensate for any mismatches in the coefficients of thermal expansion. Another advantage of the present invention is that the electrical path is shorter with the present fully aligned assembly as its solder material is also fully aligned. The present assembly, as finally fabricated, allows for symmetrical alignment of the solder bump with the package solder and the substrate pad, thereby maximizing the cross-sectional area of the solder joint which reduces its electrical path resistance well below that of the prior art assemblies. With the present advantages, manufacturing yield is increased as any die misalignment occurring during die placement is compensated by the present preconfigured variable pitch packaging substrate. Other features of the present invention are disclosed, or are apparent in the section entitled "Detailed Description of the Invention."

BRIEF DESCRIPTION OF THE DRAWINGS

For a better understanding of the present invention, reference is made to the below-referenced accompanying Drawings. Reference numbers refer to the same or equivalent parts of the present invention throughout the several figures of the Drawings.

FIG. 1A is a cross-sectional view of a flip-chip assembly, comprising: a die having a plurality of die pads thereon formed with a design die pad pitch value; a package substrate having a plurality of substrate pads thereon formed with a design substrate pad pitch value to match the design die pad pitch value; a corresponding plurality of solder bumps formed on the plurality of die pads; and a corresponding plurality of package solder elements formed on the plurality of substrate pads, wherein the plurality of solder bumps are disposed over the corresponding plurality of package solder elements, prior to a reflow process, in accordance with the prior art.

FIG. 1B is a cross-sectional view of the flip-chip assembly, as shown in FIG. 1A, comprising: a die having a plurality of die pads thereon formed with a thermally expanded and partially contracted die pad pitch value; a package substrate having a plurality of substrate pads thereon formed with a thermally expanded and partially contracted substrate pad pitch value which no longer matches the design substrate pad pitch value, the design die pad pitch value, nor the thermally expanded and partially contracted die pad pitch value; a corresponding plurality of solder bumps formed on the plurality of die pads; and a corresponding plurality of package solder elements formed on the plurality of substrate pads, wherein the plurality of solder bumps are disposed over the corresponding plurality of package solder elements, and wherein the plurality of package solder elements have been reflowed onto the corresponding plurality of solder bumps, thereby inducing internal stress in the assembly, resulting in both misalignment and "necking," in accordance with the prior art.

FIG. 1C is a schematic representation of a micrograph, at 600× magnification, of the flip-chip assembly, as shown in FIG. 1B, illustrating the misalignment and "necking" problem in the solder material, in accordance with the prior art.

FIG. 1D is a schematic representation of a micrograph, at a relatively lower magnification, of the flip-chip assembly, as shown in FIG. 1C, illustrating the misalignment and "necking" problem in the solder material, in accordance with the prior art.

FIG. 2A is a cross-sectional view of a flip-chip assembly, comprising: a die having a plurality of die pads thereon formed with a design die pad pitch value; a package substrate having a plurality of substrate pads thereon formed with a preconfigured substrate pad pitch value distinct from the design die pad pitch value and preferably less than the design die pad pitch value; a corresponding plurality of solder bumps formed on the plurality of die pads; and a corresponding plurality of package solder elements formed on the plurality of substrate pads, wherein the plurality of solder bumps are disposed over the corresponding plurality of package solder elements, prior to a reflow process, in accordance with the present invention.

FIG. 2B is a cross-sectional view of the flip-chip assembly, as shown in FIG. 2A, comprising: a die having a plurality of die pads thereon formed with a thermally expanded and partially contracted die pad pitch value; a package substrate having a plurality of substrate pads thereon formed with a thermally expanded and partially contracted substrate pad pitch value which, although not matching the design substrate pad pitch value as nor the design die pad pitch value, matches the thermally expanded and partially contracted die pad pitch value; a corresponding plurality of solder bumps formed on the plurality of die pads; and a corresponding plurality of package solder elements formed on the plurality of substrate pads, wherein the plurality of solder bumps are disposed over the corresponding plurality of package solder elements, and wherein the plurality of package solder elements have been reflowed onto the corresponding plurality of solder bumps in perfect alignment, in accordance with the present invention.

FIG. 2C is a schematic micrographic representation, at 1000× magnification, of an individual left solder joint, an individual middle solder joint, and an individual right solder joint in a fully aligned flip-chip assembly, in accordance with the present invention.

FIG. 2D is a schematic micrographic representation, at 600× magnification, of three consecutive solder joints in a fully aligned flip-chip assembly, in accordance with the present invention and in contrast to the misaligned prior-art joints shown in FIG. 1D.

FIG. 2E is a schematic micrographic representation, at 150× magnification, of a cross-sectional view of the flip-chip assembly, comprising: a die having a plurality of die pads thereon formed with a thermally expanded and partially contracted die pad pitch value; a package substrate having a plurality of substrate pads thereon formed with a thermally expanded and partially contracted substrate pad pitch value which, although not matching the design substrate pad pitch value nor the design die pad pitch value, matches the thermally expanded and partially contracted die pad pitch value; a corresponding plurality of solder bumps formed on the plurality of die pads; a corresponding plurality of package solder elements formed on the plurality of substrate pads; and a corresponding plurality of underfill elements formed and disposed between the plurality of substrate pads and optionally forming an underfill fillet, wherein the plurality of solder bumps are disposed over the corresponding plurality of package solder elements, and wherein the plurality of package solder elements have been reflowed onto the corresponding plurality of solder bumps in perfect alignment, in accordance with the present invention.

FIG. 3 is a flowchart of a method of fabricating a fully aligned flip-chip assembly having a variable pitch packaging substrate, in accordance with the present invention.

MODES FOR CARRYING OUT THE INVENTION

FIG. 2A is a cross-sectional view of a flip-chip assembly 200, comprising: a die 5 having a plurality of die pads 6 thereon formed with a design die pad pitch value (i.e., manufacturer's value) $a_d$; a package substrate 7 having a plurality of substrate pads 8 thereon formed with a preconfigured substrate pad pitch value $a_s$ distinct from the design die pad pitch value $a_d$ (i.e., $a_s \neq a_d$) and preferably less than the design die pad pitch value $a_d$ (i.e., $a_s < a_d$); a corresponding plurality of solder bumps 10 formed on the plurality of die pads 6; and a corresponding plurality of package solder elements 9 formed on the plurality of substrate pads 8, wherein the plurality of solder bumps 10 are disposed over the corresponding plurality of package solder elements 9, prior to a reflow process (i.e., a flip-chip attachment process), in accordance with the present invention.

FIG. 2B is across-sectional view of the flip-chip assembly 200, as shown in FIG. 2A, comprising: a die 5 having a plurality of die pads 6 thereon formed with a thermally expanded and partially contracted die pad pitch value $a_d'$; a package substrate 7 having a plurality of substrate pads 8 thereon formed with a thermally expanded and partially contracted substrate pad pitch value $a_s'$ which, although not matching the design substrate pad pitch value $a_s$ nor the design die pad pitch value $a_d$, matches the thermally expanded and partially contracted die pad pitch value $a_d'$ (i.e., $a_s' = a_d' \neq a_s \neq a_d$); a corresponding plurality of solder bumps 10 formed on the plurality of die pads 6; and a corresponding plurality of package solder elements 9 formed on the plurality of substrate pads 8, wherein the plurality of solder bumps 10 are disposed over the corresponding plurality of package solder elements 9, and wherein the plurality of package solder elements 9 have been reflowed onto the corresponding plurality of solder bumps 10 in final (resultant) perfect alignment, in accordance with the present invention.

In particular, the present invention plurality of substrate pads 8 are preconfigured to be purposefully and only initially misaligned with the plurality of die pads 6 at a stage of the process wherein the assembly is at room temperature prior to reflow attachment. Upon heating during the reflow attachment process, the substrate will expand at a rate greater than will the die due to their mismatched CTE. Correspondingly, the substrate pad pitch will increase at a rate greater than will the die pad pitch upon heating. At the peak reflow temperature, the substrate pad pitch will typically be slightly greater than the die pad pitch. After attachment at the peak reflow temperature, the assembly 200 will then be cooled to the equilibrium temperature $T_e$, resulting in an offset reduction between the die pad pitch and the substrate pad pitch. At the equilibrium temperature $T_e$, the plurality of die pads 6 and the plurality of substrate pads 8 will be perfectly aligned, wherein the connection between the plurality of die pads 6 and plurality of substrate pads 8 will be such that no further changes in either pitches will occur as the assembly 200 further cools below the equilibrium temperature $T_e$. Thus, at room temperature, the plurality of die pads 6 and the plurality of substrate pads 8 will be finally (i.e., resultantly) perfectly aligned through use of the present compensation technique, as shown in FIG. 2B.

Referring to present invention FIGS. 2C and 2D, FIG. 2C schematically illustrates a micrographic representation, at 1000× magnification, of an individual left solder joint 11, an individual middle solder joint 12, and an individual right solder joint 13 in a fully aligned flip-chip assembly 200, in accordance with the best mode of the present invention. In the best mode of the present invention, the individual solder joints 11, 12, 13 are formed and disposed under a die along a die length of approximately 17 mm, wherein the distance between each of joints 11, 12, and 13 is approximately 8 mm. The die width of the best mode assembly is approximately 13 mm. FIG. 2D schematically illustrates a micrographic representation, at 600× magnification, of three consecutive solder joints 16, 17, 18 in a fully aligned flip-chip assembly 200, in accordance with the present invention and in contrast to the misaligned prior art joints shown in FIG. 1D. The plurality of die pads 6 and the plurality of substrate pads 8 expand at different rates, due to their respective and distinct coefficients of thermal expansion (CTE), upon exposure to heat at the reflow temperature during the flip-chip attachment process. The plurality of package solder elements 9 melt and form both the electrical and the structural connections (i.e., the solder joints 11, 12, 13) between the plurality of substrate pads 8 and the plurality of die pads 6, wherein the plurality of die pads 6 are fully aligned with the plurality of substrate pads 8 despite any heat-induced "offset." After reflow attachment, the assembly 200 is cooled, whereby the substrate 7 both thermally expands (swells) and contracts (shrinks) at a rate different from that of the die 5 due to their mismatched CTE, wherein, despite an undesirable condition of inchoate thermogeometric hysteresis being induced, the die pads 6 will still fully align with the substrate pads 8 without any necking.

FIG. 2E is a cross-sectional view of the flip-chip assembly 200, as shown in FIG. 2A, comprising: a die 5 having a plurality of die pads 6 thereon formed with a thermally expanded and partially contracted die pad pitch value $a_d'$; a package substrate 7 having a plurality of substrate pads 8 thereon formed with a thermally expanded and partially contracted substrate pad pitch value $a_s'$ which, although not matching the design substrate pad pitch value $a_s$ nor the design die pad pitch value $a_d$, matches the thermally expanded and partially contracted die pad pitch value $a_d'$ (i.e., $a_s' = a_d' \neq a_s \neq a_d$); a corresponding plurality of solder bumps 10 formed on the plurality of die pads 6, a corresponding plurality of package solder elements 9 formed on the plurality of substrate pads 8, and a corresponding plurality of underfill elements 14 formed and disposed between the plurality of substrate pads 8 and optionally forming a underfill fillet 15, wherein the plurality of solder bumps 10 are disposed over the corresponding plurality of package solder elements 9, and wherein the plurality of package solder elements 9 have been reflowed onto the corresponding plurality of solder bumps 10 in final perfect alignment, in accordance with the present invention.

The substrate 7 of the assembly 200 may comprise at least one material selected from a group consisting essentially of a ceramic material and a polymeric material, in accordance with the present invention. The ceramic material may comprise at least one material selected from a group consisting essentially of alumina ($Al_2O_3$), aluminum nitride (AlN), beryllia (BeO), mullite ($3Al_2O_3 \cdot 2SiO_2$), quartz, and a glass ($Si_xO_y$). The polymeric material may comprise at least one material selected from a group consisting essentially of epoxy, polyimide, and cyanate ester. The epoxy material may comprise at least one material selected from a group consisting essentially of a difunctional epoxy, a tetrafunctional epoxy, and a multifunctional epoxy. The polyimide material may comprise at least one material selected from a group consisting essentially of an aramid, a toughened polyimide, and a thermally mounted polyimide.

FIG. 3 is a flowchart of a method M of fabricating a fully aligned flip-chip assembly 200 having a variable pitch packaging substrate 5, the method M comprising: providing a set of input data, as indicated by block 1000; calculating a set of intermediate data using the input data set, as indicated by block 2000; and calculating a set of final substrate pad coordinates using the intermediate data set, as indicated by block 3000, thereby providing a set of output data, as indicated by block 4000, thereby compensating for any inchoate thermogeometric hysteresis arising from any mismatched coefficients of thermal expansion, and thereby fabricating the fully aligned flip-chip assembly 200 having the variable pitch packaging substrate 7, in accordance with the present invention. The present method M may further comprise a software program and hardware for facilitating execution of the operative steps. The present method M may also further comprise the steps of: providing a packaging substrate 7 having a plurality of substrate pads 8 thereon disposed and formed according to the output data set; providing a die 5 having a plurality of die pads 6 thereon formed; forming a plurality of solder bumps 10 on the plurality of die pads 7; forming a plurality of package solder elements 9 on the plurality of substrate pads 8; and reflowing the plurality of package solder elements 9 onto the plurality of solder bumps 10, thereby forming an electrical connection and a structural connection between the plurality of die pads 7 and the plurality of substrate pads 8 (not shown in FIG. 3).

The method M may also be practiced in manner wherein the input data set providing step may comprise: providing a set of constants, as indicated by block 1010, the constants set providing step comprising: providing a characteristic temperature of a packaging substrate ($T_s$), wherein the packaging substrate characteristic temperature providing step comprises: for a substrate having a glass transition temperature, providing a glass transition temperature ($T_g$) of the substrate 7 and setting $T_s$ equal to $T_g$; and for a substrate not having a glass transition temperature, providing a flip-chip attach (i.e., a package solder element) reflow temperature ($T_{fca}$) and setting $T_s$ equal to a temperature selected from a group consisting essentially of $T_{fca}$ and infinity $\infty$ (i.e., with the assumption that $\alpha_2=0$); and providing an ambient temperature ($T_a$) approximately in the range of room temperature (~25° C.); providing a coefficient of thermal expansion of the substrate ($CTE_s$) which may comprise providing a coefficient of thermal expansion of the substrate ($CTE_s$ @ $\alpha_1$) corresponding to a temperature range less than the glass transition temperature and providing a coefficient of thermal expansion of the substrate ($CTE_s$ @ $\alpha_2$) corresponding to a temperature range greater than the glass transition temperature; and providing a coefficient of thermal expansion of a die 5 ($CTE_d$), wherein the $CTE_s$ providing step comprises providing a coefficient selected from a group consisting essentially of a linear $CTE_s$ and a constant $CTE_s$, wherein the $CTE_d$ providing step comprises providing a coefficient selected from a group consisting essentially of a linear $CTE_d$ and a constant $CTE_d$; providing a set of initial substrate pad 8 coordinates corresponding to n-number of substrate pads 8, as indicated by block 1020, the initial substrate pad 8 coordinates set providing step comprising: providing n-number of initial $x_i$-values; and providing n-number of initial $y_i$-values, wherein i= an integer ranging from 1 to n; and providing an equilibrium temperature ($T_e$) at which inchoate thermogeometric hysteresis occurs, as indicated by block 1030; providing a flip-chip attach (i.e., a package solder element) reflow temperature ($T_{fca}$), as indicated by block 1040; providing a package solder melting point ($T_{psmp}$), as indicated by block 1050; and providing an underfill cure temperature ($T_{uf}$), as indicated by block 1060, wherein the intermediate data calculating step may comprise: calculating a set of thermally expanded and partially contracted substrate pad 8 coordinates $S'(x_i, y_i)$, as indicated by blocks 2010 and 2020; and calculating a set of thermally expanded and partially contracted die pad 6 coordinates $D'(x_i, y_i)$, as indicated by block 2030, wherein the thermally expanded and partially contracted substrate pad 8 coordinates set $S'(x_i, y_i)$ calculating step may comprise a step selected from a group consisting essentially of for $T_e > T_g$, calculating $S'(x_i, y_i) = S(x_i, y_i) \cdot \{(T_g - T_a) \cdot (CTE_s @ \alpha_1) + (T_e - T_g) \cdot (CTE_s @ \alpha_2)\}$, as indicated by block 2010; and for $T_e \leq T_g$, calculating $S'(x_i, y_i) = S(x_i, y_i) \cdot \{(T_e - T_a) \cdot (CTE_s @ \alpha_1)\}$, as indicated by block 2020, and wherein the thermally expanded and partially contracted die pad 6 coordinates set $D(x_i, y_i)$ calculating step may comprise calculating $D'(x_i, y_i) = D(x_i, y_i) \cdot \{(T_e - T_a) \cdot (CTE_d)\}$, as indicated by block 2030, wherein the final substrate pad 8 coordinates set calculating step may comprise: subtracting the thermally expanded and partially contracted die pad 6 coordinates set from the thermally expanded and partially contracted substrate pad 8 coordinates set, thereby providing a set of difference values; and subtracting the difference values set from the initial substrate pad 8 coordinates set, as indicated by block 3000, wherein the final substrate pad 8 coordinates set calculating step may comprise calculating $X_v(x_i, y_i) = S(x_i, y_i)\{S'(x_i, y_i) - D'(x_i, y_i)\}$, and wherein $X_v(x_i, y_i)$= the final substrate pad 8 coordinates set for the output data set, as indicated by block 4000, in accordance with the present invention.

The present method M comprises using a derived linear expansion formula. For example, the substrate pads 8 may be formed from copper (Cu) and their geometry must be preconfigured to have a variable pitch (where pitch herein denotes the center to center distance between any two adjacent substrate pads) so that after reflow attachment, the substrate pads 8 align perfectly in the z-axis with the corresponding die pads 6 (e.g., for C4 technology). This linear expansion formula is applied in the present method M, because the substrate 7 typically expands at a greater rate than does the die 5 during reflow attachment, where the assembly 200 experiences a peak temperature (e.g., ~234° C.). The present derived linear expansion formula gives preconfigured thermally expanded and partially contracted substrate pad coordinates (i.e., variable pitch substrate coordinates) calculated from the thermally expanded and partially contracted die pad 6 coordinates, the thermally expanded and partially contracted substrate pad 8 coordinates, and the initial substrate pad 8 coordinates.

For example, the following formula may be used to calculate a substrate design coordinate for a substrate pad 8 for CTE-mismatch compensation:

$$X_v(x_i, y_i) = S(x_i, y_i) - \{S'(x_i, y_i) - D'(x_i, y_i)\}, \text{ where:}$$

$X_v(x_i, y_i)$=the final "preconfiguration" substrate coordinates for "n" substrate pads in terms of "$x_i$" and "$y_i$" direction, where i= an integer from 1 to "n,"

$S(x_i, y_i)$=the initial position of the "$i^{th}$" substrate pad coordinate, $S'(x_i, y_i)$=the differential expansion of the "$i^{th}$" substrate pad coordinate from ambient to the equilibrium temperature (i.e., $x_O$ to $x_i$ and $y_o$ to $y_i$), and $D'(x_i, y_i)$=the differential expansion of the "$i^{th}$" die pad coordinate from ambient to the equilibrium temperature (i.e., $x_o$ to $x_i$ and $y_o$ to $y_i$).

The following formula is used in the present invention for calculating (i.e., predicting) the expansion of the substrate and its pads from ambient temperature, ramping up to the reflow temperature, and then ramping down to the equilibrium temperature:

$$S'(x_i, y_i) = S(x_i, y_i) \cdot \{(T_g - T_a) \cdot (CTE_s @ \alpha_1) + (T_e - T_g) \cdot (CTE_s @ \alpha_2)\},$$
where:

$T_g$=the glass transition temperature of the substrate,
$T_e$=the equilibrium temperature,
$T_a$=the ambient temperature (~25° C.),
$CTE_s$ @ $\alpha_1$=the coefficient of thermal expansion of the substrate in the temperature range below the glass transition temperature ($T_g$) of the substrate, and
$CTE_s$ @ $\alpha_2$=the coefficient of thermal expansion of the substrate in the temperature range above the glass transition temperature ($T_g$) of the substrate.

The following formula is used for determining the expansion of the die and its pads from ambient temperature, ramping up to the reflow temperature, and then ramping down to the equilibrium temperature:

$$D'(x_i, y_i) = D(x_i, y_i) \cdot \{(T_e - T_a) \cdot (CTE_d)\}, \text{ where}$$

$D(x_i, y_i)$=the initial position of the "$i^{th}$" die pad coordinate,
$T_e$=the equilibrium temperature,
$T_a$=the ambient temperature (~25° C.), and
$CTE_d$=the coefficient of thermal expansion of the die.

The foregoing formulas for both $S'(x_i, y_i)$ and $D'(x_i, y_i)$ are crucial in the present invention for determining the extent to which the substrate and the die will expand during the reflow step. After the functions $S'(x_i, y_i)$ and $D'(x, y_i)$ are determined, their respective coordinates are inserted into the expression $X_v(x_i, y_i) = S(x_i, y_i) - \{S'(x_i, y_i) - D'(x_i, y_i)\}$ for calculating a set of final substrate pad coordinates $X_v(x_i, y_i)$ using the intermediate data set, thereby providing an output data set for preconfiguring the substrate 7 in compensating for the inchoate thermogeometric hysteresis arising from any mismatched coefficients of thermal expansion.

Information, as herein shown and described in detail, is fully capable of attaining the above-described advantages of the invention, the presently preferred embodiment of the invention, and is, thus, representative of the subject matter which is broadly contemplated by the present invention. The scope of the present invention fully encompasses other embodiments which may become obvious to those skilled in the art, and is to be accordingly limited by nothing other than the appended claims, wherein reference to an element in the singular is not intended to mean "one and only one" unless explicitly so stated, but rather "one or more." All structural and functional equivalents to the elements of the above-described preferred embodiment and additional embodiments that are known to those of ordinary skill in the art are hereby expressly incorporated by reference and are intended to be encompassed by the present claims.

Moreover, no requirement exists for a device or method to address each and every problem sought to be resolved by the present invention, for such to be encompassed by the present claims. Furthermore, no element, component, or method step in the present disclosure is intended to be dedicated to the public, regardless of whether the element, component, or method step is explicitly recited in the claims. However, that various changes and modifications in form, semiconductor material, and fabrication material detail may be made, without departing from the spirit and scope of the invention as set forth in the appended claims, should be readily apparent to those of ordinary skill in the art. No claim herein is to be construed under the provisions of 35 U.S.C. § 112, sixth paragraph, unless the element is expressly recited using the phrase "means for."

INDUSTRIAL APPLICABILITY

The present invention applies industrially to the assembly and the packaging of semiconductor chips. More particularly, the present invention applies industrially to the assembly and the packaging of flip-chips. Even more particularly, the present invention applies industrially to reducing stress in the flip-chip assembly.

What is claimed is:

1. A method of fabricating a fully aligned flip-chip assembly having a variable pitch packaging substrate, comprising:

providing a set of input data;

calculating a set of intermediate data using the input data set; and calculating a set of final substrate pad coordinates using the intermediate data set, thereby providing a set of output data, thereby compensating for any inchoate thermogeometric hysteresis arising from any mismatched coefficients of thermal expansion, and thereby fabricating the fully aligned flip-chip assembly having the variable pitch packaging substrate.

2. A method, as recited in claim 1, wherein the input data set providing step comprises:

providing a set of constants, the constants set providing step comprising:

providing a characteristic temperature of a packaging substrate (Ts):

providing an ambient temperature ($T_a$) approximately in the range of room temperature (~25° C.);

providing a coefficient of thermal expansion of the substrate ($CTE_s$); and providing a coefficient of thermal expansion of a die ($CTE_d$);

providing a set of initial substrate pad coordinates corresponding to n-number of substrate pads, the initial substrate pad coordinates set providing step comprising:

providing n-number of initial $x_i$-values; and providing n-number of initial $y_i$-values, wherein i=an integer ranging from 1 to n; and providing an equilibrium temperature ($T_e$) at which inchoate thermogeometric hysteresis occurs.

3. A method, as recited in claim 2, wherein the input data set providing step further comprises:

providing a flip-chip attach (i.e. package solder element) reflow temperature ($T_{fca}$); and providing at least one melting point selected from a group consisting essentially of a package solder melting point ($T_{psmp}$) and a solder bump melting point ($T_{sbmp}$), wherein the packaging substrate characteristic temperature providing step comprises:

for a substrate having a glass transition temperature, providing a glass transition temperature ($T_g$) of the substrate and setting $T_s$ equal to $T_g$; and for a substrate not having a glass transition temperatures providing a flip-chip attach reflow temperature ($T_{fca}$) and setting $T_s$ equal to a temperature selected from a group consisting essentially of $T_{fca}$ and infinity $\infty$, wherein the $CTE_s$ providing step comprises:

for a substrate having a glass transition temperature, providing a coefficient of thermal expansion of the substrate ($CTE_s$ @ $\alpha_1$) corresponding to a temperature range less than the glass transition temperature; and providing a coefficient of thermal expansion of the substrate ($CTE_s$ @ $\alpha_2$) corresponding to a temperature range greater than the glass transition temperature; and for a substrate not having a glass transition temperature, providing a coefficient of thermal expansion of the substrate ($CTE_s$ @ $\alpha_1$) corresponding to a temperature selected from a group consisting essentially of $T_{fca}$ and infinity $\infty$, wherein the $CTE_s$ providing step comprises providing a coefficient selected from a group consisting essentially of a linear $CTE_s$ and a constant $CTE_s$, and wherein the $CTE_d$ providing step comprises providing a coefficient selected from a group consisting essentially of a linear $CTE_d$ and a constant $CTE_d$.

4. A method, as recited in claim 3, wherein the input data set providing step further comprises providing an underfill cure temperature ($T_{uf}$).

5. A method, as recited in claim 1, wherein the intermediate data calculating step comprises:

calculating a set of thermally expanded and partially contracted substrate pad coordinates $S'(x_i, y_i)$; and calculating a set of thermally expanded and partially contracted die pad coordinates $D'(x_i, y_i)$.

6. A method, as recited in claim 5, wherein the thermally expanded substrate pad coordinates set $S'(x_i, y_i)$ calculating step comprises:

for $T_e > T_g$, calculating $S'(x_i, y_i) = S(x_i, y_i) \cdot \{(T_g - T_s) \cdot (CTE_s$ @ $\alpha_1) + (T_e - T_g) \cdot (CTE_s$ @$\alpha_2)\}$; and for $T_e \leq T_g$, calculating $S'(x_i, y_i) = S(x_i, y_i) \cdot \{(T_e - T_a) \cdot (CTE_s$ @ $\alpha_1)\}$, and wherein the thermally expanded die pad coordinates set $D(x_i, y_i)$ calculating step comprises calculating $D'(x_i, y_i) = D(x_i, y_i) \cdot \{(T_e - T_a) \cdot (CTE_d)\}$.

7. A method, as recited in claim 1, wherein the final substrate pad coordinates set calculating step comprises:

subtracting the thermally expanded and partially contracted die pad coordinates set from the thermally expanded and partially contracted substrate pad coordinates set, thereby providing a set of difference values; and subtracting the difference values set from the initial substrate pad coordinates set.

8. A method, as recited in claim 7, wherein the final substrate pad coordinates set calculating step comprises calculating $X_v(x_i, y_i) = S(x_i, y_i) - \{S'(x_i, y_i) - D'(x_i, y_i)\}$, and wherein $X_v(x_i, y_i)$ = the final substrate pad coordinates set.

9. A method, as recited in claim 1, further comprising a software program for facilitating execution of operative steps, wherein the input data set providing step comprises:

providing a set of constants, the constants set providing step comprising:

providing a characteristic temperature of a packaging substrate ($T_s$);

providing an ambient temperature ($T_a$) approximately in the range of room temperature (~25° C.);

providing a coefficient of thermal expansion of the substrate ($CTE_s$); and providing a coefficient of thermal expansion of a die ($CTE_d$);

providing a set of initial substrate pad coordinates corresponding to n-number of substrate pads, the initial substrate pad coordinates set providing step comprising:

providing n-number of initial $x_i$-values; and providing n-number of initial $y_i$-values, wherein i=an integer ranging from 1 to n; and providing an equilibrium temperature ($T_e$) at which inchoate thermogeometric hysteresis occurs, wherein the input data set providing step further comprises:

providing a flip-chip attach (i.e., package solder element) reflow temperature ($T_{fca}$); and providing at least one melting point selected from a group consisting essentially of a package solder melting point ($T_{psmp}$) and a solder bump melting point ($T_{sbmp}$), wherein the packaging substrate characteristic temperature providing step comprises:

for a substrate having a glass transition temperature, providing a glass transition temperature ($T_g$) of the substrate and setting $T_s$ equal to $T_g$; and for a substrate not having a glass transition temperature, providing a flip-chip attach reflow temperature ($T_{fca}$) and setting $T_s$ equal to a temperature selected from a group consisting essentially of $T_{fca}$ and infinity $\infty$, wherein the $CTE_s$ providing step comprises:

for a substrate having a glass transition temperature;

providing a coefficient of thermal expansion of the substrate ($CTE_s$ @ $\alpha_1$) corresponding to a temperature range less than the glass transition temperature; and providing a coefficient of thermal expansion of the substrate ($CTE_s$ @ $\alpha_2$) corresponding to a temperature range greater than the glass transition temperature; and for a substrate not having a glass transition temperature, providing a coefficient of thermal expansion of the substrate ($CTE_s$ @ $\alpha_1$) corresponding to a temperature selected from a group consisting essentially of $T_{fca}$ and infinity $\infty$, wherein the $CTE_s$ providing step comprises providing a coefficient selected from a group consisting essentially of a linear $CTE_s$ and a constant $CTE_s$, wherein the $CTE_d$ providing step comprises providing a coefficient selected from a group consisting essentially of a linear $CTE_d$ and a constant $CTE_d$, wherein the input data set providing step further comprises providing an underfill cure temperature ($T_{uf}$), wherein the intermediate data calculating step comprises:
calculating a set of thermally expanded and partially contracted substrate pad coordinates $S'(x_i, y_i)$; and
calculating a set of thermally expanded and partially contracted die pad coordinates $D'(x_i, y_i)$, wherein the thermally expanded substrate pad coordinates set $S'(x_i, y_i)$ calculating step comprises:
for $T_e > T_g$, calculating $S'(x_i, y_i) = S(x_i, y_i) \cdot \{(T_g - T_a) \cdot (CTE_s @ \alpha_1) + (T_e - T_g) \cdot (CTE_s @ \alpha_2)\}$; and
for $T_e \leq T_g$, calculating $S'(x_i, y_i) = S(x_i, y_i) \cdot \{(T_e - T_a) \cdot (CTE_s @ \alpha_1\}$, wherein the thermally expanded die pad coordinates set $D(x_i, y_i)$ calculating step comprises calculating $D'(x_i, y_i) = D(x_i, y_i) \cdot \{(T_e - T_a) \cdot (CTE_d)\}$, wherein the final substrate pad coordinates set calculating step comprises:
subtracting the thermally expanded and partially contracted die pad coordinates set from the thermally expanded and partially contracted substrate pad coordinates set, thereby providing a set of difference values; and
subtracting the difference values set from the initial substrate pad coordinates set, wherein the final substrate pad coordinates set calculating step comprises calculating $X_v(x_i, y_i) = S(x_i, y_i) - \{S'(x_i, y_i) - D'(x_i, y_i)\}$, and wherein $X_v(x_i, y_i)$=the final substrate pad coordinates set.

10. A method of fabricating a fully aligned flip-chip assembly having a variable pitch packaging substrate, comprising:

providing a set of input data;
calculating a set of intermediate data using the input data set;
calculating a set of final substrate pad coordinates using the intermediate data set, thereby providing a set of output data;
providing a packaging substrate having a plurality of substrate pads thereon formed according to the output data set;
providing a die having a plurality of die pads thereon formed;
forming a plurality of solder bumps on the plurality of die pads;
forming a plurality of package solder elements on the plurality of substrate pads; and
reflowing the plurality of package solder elements onto the plurality of solder bumps, thereby forming an electrical and a structural connection between the plurality of die pads and the plurality of substrate pads,
thereby compensating for any inchoate thermogeometric hysteresis arising from any mismatched coefficients of thermal expansion, and
thereby fabricating the fully aligned flip-chip assembly having the variable pitch packaging substrate.

11. A method, as recited in claim 10, wherein the input data set providing step comprises:
providing a set of constants, the constants set providing step comprising:
providing a characteristic temperature of a packaging substrate ($T_s$);
providing an ambient temperature ($T_a$) approximately in the range of room temperature (~25° C.);
providing a coefficient of thermal expansion of the substrate ($CTE_s$); and
providing a coefficient of thermal expansion of a die ($CTE_d$);
providing a set of initial substrate pad coordinates corresponding to n-number of substrate pads, the initial substrate pad coordinates set providing step comprising:
providing n-number of initial $x_i$-values; and
providing n-number of initial $y_i$-values,
wherein i=an integer ranging from 1 to n; and
providing an equilibrium temperature ($T_e$) at which inchoate thermogeometric hysteresis occurs.

12. A method, a, recited in claim 11,
wherein the input data set providing step further comprises:
providing a flip-chip attach (i.e., package solder element) reflow temperature ($T_{fca}$); and
providing at least one melting point selected from a group consisting essentially of a package solder melting point ($T_{psmp}$) and a solder bump melting point ($T_{sbmp}$),
wherein the packaging substrate characteristic temperature providing step comprises:
for a substrate having a glass transition temperature, providing a glass transition temperature ($T_g$) of the substrate and setting $T_s$ equal to $T_g$; and
for a substrate not having a glass transition temperature, providing a flip-chip attach reflow temperature ($T_{fca}$) and setting $T_s$ equal to a temperature selected from a group consisting essentially of $T_{fca}$ and infinity ∞, and
wherein the $CTE_s$ providing step comprises:
for a substrate having a glass transition temperature,
providing a coefficient of thermal expansion of the substrate ($CTE_s @ \alpha_1$) corresponding to a temperature range less than the glass transition temperature; and
providing a coefficient of thermal expansion of the substrate ($CTE_s @ \alpha_2$) corresponding to a temperature range greater than the glass transition temperature; and for a substrate not having a glass transition temperature.
providing a coefficient of thermal expansion of the substrate ($CTE_s @ \alpha_1$) corresponding to a temperature selected from a group consisting essentially of $T_{fca}$ and infinity ∞,
wherein the $CTE_s$ providing step comprises providing a coefficient selected from a group consisting essentially of a linear $CTE_s$ and a constant $CTE_s$, and
wherein the $CTE_d$ providing step comprises providing a coefficient selected from a group consisting essentially of a linear $CTE_d$ and a constant $CTE_d$.

13. A method, as recited in claim 12, further comprising providing an underfill cure temperature ($T_{uf}$).

14. A method, as recited in claim 10, wherein the intermediate data calculating step comprises:
calculating a set of thermally expanded and partially contracted substrate pad coordinates $S'(x_i, y_i)$; and
calculating a set of thermally expanded and partially contracted die pad coordinates $D'(x_i, y_i)$.

15. A method, as recited in claim 14,
wherein the thermally expanded and partially contracted substrate pad coordinates set $S'(x_i, y_i)$ calculating step comprises:

for $T_e > T_g$, calculating $S'(x_i, y_i) = S(x_i, y_i) \cdot \{(T_g - T_a) \cdot (CTE_s @ \alpha_1) + (T_e - T_g) \cdot (CTE_s @ \alpha_2)\}$; and for $T_e \leq T_g$, calculating $S'(x_i, y_i) = S(x_i, y_i) \cdot \{(T_e - T_a) \cdot (CTE_s @ \alpha_1)\}$, and wherein the thermally expanded die pad coordinates set $D'(x_i, y_i)$ calculating step comprises calculating $D'(x_i, y_i) = D(x_i, y_i) \cdot \{(T_e - T_a) \cdot (CTE_d)\}$.

16. A method, as recited in claim 10, wherein the final substrate pad coordinates set calculating step comprises:

subtracting the thermally expanded and partially contracted die pad coordinates set from the thermally expanded and partially contracted substrate pad coordinates set, thereby providing a set of difference values; and subtracting the difference values set from the initial substrate pad coordinates set.

17. A method, as recited in claim 16, wherein the final substrate pad coordinates set calculating step comprises calculating $X_v(x_i, y_i) = S(x_i, y_i) - \{S'(x_i, y_i) - D'(x_i, y_i)\}$, and wherein $X_v(x_i, y_i)$ = the final substrate pad coordinates set.

18. A method, as recited in claim 10, wherein the input data set providing step comprises:

providing a set of constants, the constants set providing step comprising:

providing a characteristic temperature of a packaging substrate $(T_s)$;

providing an ambient temperature $(T_a)$ approximately in the range of room temperature (~25° C.);

providing a coefficient of thermal expansion of the substrate $(CTE_s)$; and providing a coefficient of thermal expansion of a die $(CTE_d)$;

providing a set of initial substrate pad coordinates corresponding to n-number of substrate pads, the initial substrate pad coordinates set providing step comprising:

providing n-number of initial $x_i$-values; and
providing n-number of initial $y_i$-values, wherein i=an integer ranging from 1 to n; and providing an equilibrium temperature $(T_e)$ at which inchoate thermogeometric hysteresis occurs, wherein the input data set providing step further comprises:

providing a flip-chip attach (i.e., package solder element) reflow temperature $(T_{fca})$, and providing at least one melting point selected from a group consisting essentially of a package solder melting point $(T_{psmp})$ and a solder bump melting point $(T_{sbmp})$, wherein the packaging substrate characteristic temperature providing step comprises:

for a substrate having a glass transition temperature, providing a glass transition temperature $(T_g)$ of the substrate and setting $T_s$ equal to $T_g$; and for a substrate not having a glass transition temperature, providing a flip-chip attach reflow temperature $(T_{fca})$ and setting $T_s$ equal to a temperature selected from a group consisting essentially of $T_{fca}$ and infinity $\infty$, and wherein the $CTE_s$ providing step comprises:

for a substrate having a glass transition temperature, providing a coefficient of thermal expansion of the substrate $(CTE_{s\ @\ \alpha_1})$ corresponding to a temperature range less than the glass transition temperature; and providing a coefficient of thermal expansion of the substrate $(CTE_{s\ @\ \alpha_2})$ corresponding to a temperature range greater than the glass transition temperature; and for a substrate not having a glass transition temperature, providing a coefficient of thermal expansion of the substrate $(CTE_s @ \alpha_1)$ corresponding to a temperature selected from a group consisting essentially of $T_{fca}$ and infinity $\infty$, wherein the $CTE_s$ providing step comprises providing a coefficient selected from a group consisting essentially of a linear $CTE_s$ and a constant $CTE_s$, wherein the $CTE_d$ providing step comprises providing a coefficient selected from a group consisting essentially of a linear $CTE_d$ and a constant $CTE_d$, wherein the input data set providing step further comprises providing an underfill cure temperature $(T_{uf})$, wherein the intermediate data calculating step comprises:

calculating a set of thermally expanded and partially contracted substrate pad coordinates $S'(x_i, y_i)$; and calculating a set of thermally expanded and partially contracted die pad coordinates $D'(x_i, y_i)$, wherein the thermally expanded substrate pad coordinates set $S'(x_i, y_i)$ calculating step comprises:

for $T_e > T_g$, calculating $S'(x_i, y_i) = S(x_i, y_i) \cdot \{(T_g - T_a) \cdot (CTE_s @ \alpha_1) + (T_{e-Tg}) \cdot (CTE_s @ \alpha_2)\}$; and for $T_e \leq T_g$, calculating $S'(x_i, y_i) = S(x_i, y_i) \cdot \{(T_e, T_a) \cdot (CTE_s @ \alpha_1)\}$, wherein the thermally expanded die pad coordinates set $D(x_i, y_i)$ calculating step comprises calculating $D'(x_i, y_i) = D(x_i, y_i)\{(T_e - T_a) \cdot (CTE_d)\}$, wherein the final substrate pad coordinates set calculating step comprises:

subtracting the thermally expanded and partially contracted die pad coordinates set from the thermally expanded and partially contracted substrate pad coordinates set, thereby providing a set of difference values; and subtracting the difference values set from the initial substrate pad coordinates set, wherein the final substrate pad coordinates set calculating step comprises calculating $X_v(x_i, y_i) = S(x_i, y_i) - \{S'(x_i, y_i) - D'(x_i, y_i)\}$, and wherein $X_v(x_i, y_i)$ = the final substrate pad coordinates set.

* * * * *